US011743609B2

(12) United States Patent
Miyake

(10) Patent No.: US 11,743,609 B2
(45) Date of Patent: *Aug. 29, 2023

(54) IMAGING DEVICE

(71) Applicant: Panasonic Intellectual Property Management Co., Ltd., Osaka (JP)

(72) Inventor: Yasuo Miyake, Osaka (JP)

(73) Assignee: PANASONIC INTELLECTUAL PROPERTY MANAGEMENT CO., LTD., Osaka (JP)

(*) Notice: Subject to any disclaimer, the term of this patent is extended or adjusted under 35 U.S.C. 154(b) by 181 days.

This patent is subject to a terminal disclaimer.

(21) Appl. No.: 17/230,870

(22) Filed: Apr. 14, 2021

(65) Prior Publication Data

US 2021/0235030 A1 Jul. 29, 2021

Related U.S. Application Data

(63) Continuation of application No. 16/670,767, filed on Oct. 31, 2019, now Pat. No. 11,006,057, which is a
(Continued)

(30) Foreign Application Priority Data

Jan. 22, 2016 (JP) ................................ 2016-010611

(51) Int. Cl.
*H04N 25/583* (2023.01)
*H01L 27/146* (2006.01)
(Continued)

(52) U.S. Cl.
CPC ..... *H04N 25/583* (2023.01); *H01L 27/14665* (2013.01); *H04N 25/571* (2023.01);
(Continued)

(58) Field of Classification Search
CPC .......... H04N 5/35554; H04N 5/35509; H04N 5/35581; H04N 5/3559; H04N 5/3745; H04N 5/378; H01L 27/14665
See application file for complete search history.

(56) References Cited

U.S. PATENT DOCUMENTS 10,498,981 B2    12/2019 Miyake
11,006,057 B2 *   5/2021 Miyake ............... H04N 5/3559
(Continued)

FOREIGN PATENT DOCUMENTS

JP      2-194779       8/1990
JP      10-257382      9/1998
JP      2002-152602 A  5/2002

OTHER PUBLICATIONS

Non-Final Office Action issued in U.S. Appl. No. 16/670,767, dated Sep. 21, 2020.
(Continued)

*Primary Examiner* — Twyler L Haskins
*Assistant Examiner* — Fayez A Bhuiyan
(74) *Attorney, Agent, or Firm* — McDermott Will & Emery LLP

(57) ABSTRACT

An imaging device including a pixel array including pixels, each pixel including a photoelectric converter including a first and second electrode, and a first photoelectric conversion layer between the first and second electrode, and a transistor having a gate coupled to the first electrode, the transistor outputting a signal corresponding to an amount of the signal charge collected by the first electrode. The device further including voltage supply circuitry coupled to the second electrode of each of the pixels, where the voltage supply circuitry, in each of consecutive frame periods, supplies a first voltage two or more times to form exposure periods in which the signal charge is collected by the first electrode, and supplies a second voltage one or more times
(Continued)

to form non-exposure periods that separate the exposure periods from each other, and start time of each of the exposure periods is periodic over the consecutive frame periods.

10 Claims, 7 Drawing Sheets

Related U.S. Application Data continuation of application No. 15/404,876, filed on Jan. 12, 2017, now Pat. No. 10,498,981.

(51) Int. Cl.
*H04N 25/59* (2023.01)
*H04N 25/77* (2023.01)
*H04N 25/571* (2023.01)
*H04N 25/589* (2023.01)
*H04N 25/75* (2023.01)

(52) U.S. Cl.
CPC ........... *H04N 25/589* (2023.01); *H04N 25/59* (2023.01); *H04N 25/77* (2023.01); *H04N 25/75* (2023.01)

(56) References Cited

U.S. PATENT DOCUMENTS

| | | |
|---|---|---|
| 2013/0113060 A1 | 5/2013 | Matsunaga |
| 2015/0009375 A1 | 1/2015 | Agranov et al. |
| 2015/0256776 A1 | 9/2015 | Okada |
| 2016/0119562 A1 | 4/2016 | Takase et al. |

OTHER PUBLICATIONS

Notice of Allowance issued in U.S. Appl. No. 16/670,767, dated Sep. 21, 2020.
Notice of Allowance issued in U.S. Appl. No. 16/670,767, dated Jan. 15, 2021.

* cited by examiner

IMAGING DEVICE

RELATED APPLICATIONS

This application is a continuation of U.S. application Ser. No. 16/670,767, filed Oct. 31, 2019, which is a continuation of U.S. application Ser. No. 15/404,876, now U.S. Pat. No. 10,498,981, filed Jan. 12, 2017, which in turn claims the benefit of Japanese Application No. 2016-010611, filed Jan. 22, 2016, the disclosures of which are incorporated by reference herein.

BACKGROUND

1. Technical Field

The present disclosure relates to an imaging device.

2. Description of the Related Art

Imaging devices having various functions have been proposed. For example, U.S. Patent Application Publication No. 2015/0009375 discloses an imaging device that includes a first transfer transistor coupled between a photodiode and a power source and a second transfer transistor coupled between the photodiode and a charge accumulation region. In the imaging device, the exposure time is non-continuous and includes a plurality of exposure periods shorter than the total exposure time. In the imaging device, the photodiode is reset using the first transfer transistor prior to the start of exposure, and charge is transferred from the photodiode to the charge accumulation region by using the second transfer transistor subsequent to the termination of exposure. It is described that the above imaging device reduces the degree of blurring of an image of a dynamic scene while maintaining the amount of exposure by dividing the exposure time into non-continuous periods of exposure time.

SUMMARY

Imaging devices capable of controlling the amount of exposure without changing the degree of blurring of the subject have been anticipated.

One non-limiting and exemplary embodiment provides an imaging device including a pixel array including pixels, each of the pixels including: a photoelectric converter including a first electrode, a second electrode, and a first photoelectric conversion layer between the first electrode and the second electrode, the first photoelectric conversion layer generating signal charge, and a transistor having a gate coupled to the first electrode, the transistor being configured to output a signal corresponding to an amount of the signal charge collected by the first electrode. The imaging device further including voltage supply circuitry coupled to the second electrode of each of the pixels, wherein the voltage supply circuitry, in each of consecutive frame periods, supplies a first voltage two or more times to form exposure periods in which the signal charge is collected by the first electrode, and supplies a second voltage one or more times to form non-exposure periods that separate the exposure periods from each other, and the start time of each of the exposure periods is periodic over the consecutive frame periods.

It should be noted that general or specific embodiments may be implemented as an element, a device, an apparatus, a system, an integrated circuit, and a method, a computer program, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to obtain one or more of such benefits and/or advantages.

DETAILED DESCRIPTION

Figure 1:
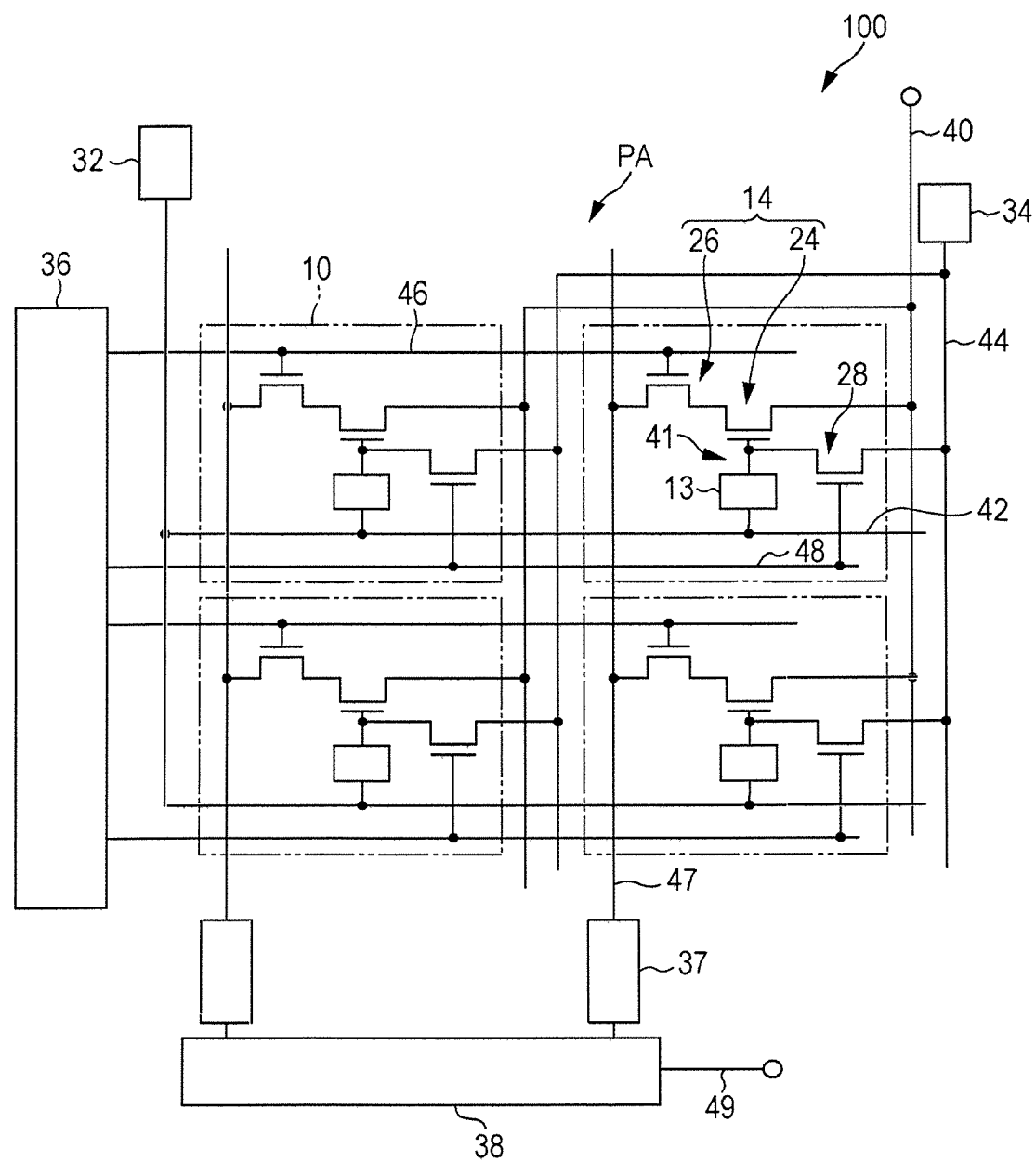
FIG. 1 is a diagram schematically illustrating an exemplary circuit structure of an imaging device according to an embodiment of the present disclosure.

According to the studies conducted by the inventor of the present invention, the imaging device disclosed in U.S. Patent Application Publication No. 2015/0009375 controls the amount of exposure to be consistent by changing the amount of exposure time when the intensity of light incident on the imaging device varies. Thus, the amount of exposure time varies with the brightness of the subject. This may result in an unnatural change in the degree of blurring of the subject.

An imaging device with a photoelectric conversion layer generates electron-hole pairs in the photoelectric conversion layer by receiving light, and separates the electron-hole pairs by applying a bias voltage to the photoelectric conversion layer. The imaging device detects one of the resulting carriers as signal charge. The inventor of the present invention found that it is possible to change the sensitivity of the photoelectric conversion layer of such an imaging device by reducing the bias voltage applied to the photoelectric conversion layer. In addition, the inventor found that this does not substantially affect the signal charge accumulated in charge accumulation regions. Specifically, it was found that the signal charge accumulated in the charge accumulation regions can be integrated even when a cycle of increase and decrease in the bias voltage is repeated. This makes it possible to control the amount of exposure without changing the amount of exposure time. The inventor of the present invention conceived a novel imaging device on the basis of the above findings. The summary of an aspect of the present disclosure is as follows.

[1] An imaging device comprising:
one or more unit pixel cells including a first unit pixel cell, the first unit pixel cell including
a first electrode,
a second electrode facing the first electrode,
a first photoelectric conversion layer between the first electrode and the second electrode, the first photoelectric conversion layer generating first signal charge, and
a first signal detection circuit connected to the first electrode, the first signal detection circuit detecting the first signal charge; and
a voltage supply circuit that supplies a voltage to the second electrode, wherein,
the voltage supply circuit forms exposure periods and one or more non-exposure periods that separate the exposure periods from each other by changing the voltage, the exposure periods and the one or more non-exposure periods being included in each of a first frame period and a second frame period subsequent to the first frame period,
timing of a start and an end of each of the exposure periods in the first frame period is the same as timing of a start and an end of each of the exposure periods in the second frame period, and
magnitude of change of the voltage in the first frame period is different from magnitude of change of the voltage in the second frame period.

[2] The imaging device described in [1], comprising a first controller that causes the voltage supply circuit to supply the voltage.

[3] The imaging device described in [2], wherein the first signal detection circuit outputs a signal as image data corresponding to one frame, the signal including a signal obtained in each of the exposure periods.

[4] The imaging device described in [2], wherein the voltage supply circuit supplies a first voltage in the exposure periods and supplies a second voltage in the one or more non-exposure periods, and the first voltage is constant in each of the first frame period and the second frame period.

[5] The imaging device described in [2], wherein
the voltage supply circuit supplies a first voltage in the exposure periods and supplies a second voltage in the one or more non-exposure periods, and
the first voltage in the first frame period is different from the first voltage in the second frame period.

[6] The imaging device described in [2], wherein a sensitivity of the unit pixel cell per unit time in each of the exposure periods in the first frame period is different from a sensitivity of the unit pixel cell per unit time in each of the exposure periods in the second frame period.

[7] The imaging device described in [2], wherein the first frame period and the second frame period are alternately repeated.

[8] The imaging device described in [2], wherein
the one or more unit pixels are arranged in a two-dimensional array having rows and columns,
the one or more unit pixel cells include a second unit pixel cell, the second unit pixel cell including
a third electrode,
a fourth electrode facing the third electrode,
a second photoelectric conversion layer between the third electrode and the fourth electrode, the second photoelectric conversion layer generating second signal charge, and
a second signal detection circuit connected to the third electrode, the second signal detection circuit detecting the second signal charge,
a row in which the first unit pixel cell is located is different from a row in which the second unit pixel cell is located, and
the first signal detection circuit outputs a signal of the first unit pixel cell at first timing in a frame period, the second signal detection circuit outputting a signal of the second unit pixel cell at second timing different from the first timing in the frame period.

[9] The imaging device described in [8], comprising a second controller that causes the first signal detection circuit to output the signal of the first unit pixel cell, and causes the second signal detection circuit to output the signal of the second unit pixel cell.

[10] An imaging device including a plurality of unit pixels arranged in a one-dimensional or two-dimensional array, and a driving unit that drives the plurality of unit pixels and acquires an image at a plurality of timings,
the plurality of unit pixels each including
a photoelectric conversion layer having first and second surfaces on opposite sides thereof,
a first electrode disposed on the first surface,
a second electrode disposed on the second surface, and
a signal detection circuit connected to the first electrode, the signal detection circuit detecting signal charge generated in the photoelectric conversion layer,
the driving unit acquiring a plurality of sets of image data at a plurality of timings by multiple exposure in each frame by changing the difference in potential between the first electrode and the second electrode,
wherein the amount of change in the difference in potential between the first electrode and the second electrode varies between the n-th frame and the (n+1)-th frame.

The imaging device described in [8] enables the amount of exposure to be controlled without changing the amount of exposure time while maintaining the degree of blurring of the subject.

[11] The imaging device described in [10], wherein the driving unit integrates the plurality of sets of imaging data acquired in each frame and outputs the integrated imaging data.

[12] The imaging device described in [10] or [11], wherein the amount of change in the difference in potential between the first electrode and the second electrode does not vary in the frame.

[13] The imaging device described in any one of [10]-[12], wherein the sensitivity of the unit pixels per unit time varies between the n-th frame and the (n+1)-th frame.

Embodiments of the present disclosure are described below in detail with reference to the attached drawings. In the following embodiments, general or specific examples are described. All the values, shapes, materials, components, the arrangement of the components, and the connection between the components, steps, and the order of the steps described in the following embodiments are merely an example and are not intended to limit the scope of the present disclosure. The various aspects described herein may be combined with one another unless a contradiction arises. Among the components described in the following embodiments, components that are not described in any one of the independent claims, which indicate the broadest concepts, are described as optional components. In the following description, components that have substantially the same function are denoted by the same reference numeral, and the description thereof may be omitted.

Circuit Structure of Imaging device

FIG. 1 is an exemplary circuit structure of an imaging device according to an embodiment of the present disclosure. The imaging device 100 illustrated in FIG. 1 includes a pixel array PA that includes a plurality of unit pixels 10 arranged in a two-dimensional array. FIG. 1 schematically illustrates an example where the unit pixels 10 are arranged in a matrix having two rows and two columns. Needless to say that the number and arrangement of the unit pixels 10 included in the imaging device 100 are not limited to those in the example illustrated in FIG. 1. The unit pixels 10 may be arranged in a two-dimensional array or a one-dimension array.

The unit pixels 10 each include a photoelectric conversion unit 13 and a signal detection circuit 14. As described below with reference to the drawings, the photoelectric conversion unit 13 includes two electrodes facing each other and a photoelectric conversion layer interposed therebetween and generates a signal upon receiving incident light. The photoelectric conversion unit 13 is not necessarily an element in which all the components are exclusively provided for each of the unit pixels 10. For example, some of the components of the photoelectric conversion unit 13 may extend across the plurality of unit pixels 10. The signal detection circuit 14 is a circuit that detects the signal generated by the photoelectric conversion unit 13. In this example, the signal detection circuit 14 includes a signal detection transistor 24 and an address transistor 26. The signal detection transistor 24 and the address transistor 26 are typically field-effect transistors (FETs). In the following description, the signal detection transistor 24 and the address transistor 26 are N-channel MOS transistors.

As described schematically in FIG. 1, the control terminal (i.e., the gate) of the signal detection transistor 24 is electrically connected to the photoelectric conversion unit 13. The signal charge carriers (i.e., holes or electrons) generated by the photoelectric conversion unit 13 are accumulated at a charge accumulation node 41 (also referred to as "floating diffusion node"), which is located between the gate of the signal detection transistor 24 and the photoelectric conversion unit 13. The detailed structure of the photoelectric conversion unit 13 is described below.

The imaging device 100 includes a driving unit that drives the pixel array PA and acquires an image at a plurality of timings. The driving unit includes a voltage supply circuit 32, a reset voltage source 34, a vertical scanning circuit 36, a column-signal processing circuit 37, and a horizontal-signal readout circuit 38. The driving unit may include a controller that controls the voltage supply circuit 32, the reset voltage source 34, the vertical scanning circuit 36, the column-signal processing circuit 37, and the horizontal-signal readout circuit 38.

The photoelectric conversion unit 13 included in each of the unit pixels 10 is connected to the corresponding one of sensitivity control lines 42. In the exemplary structure illustrated in FIG. 1, the sensitivity control lines 42 are connected to the voltage supply circuit 32. As described below in detail, the voltage supply circuit 32 supplies different voltages to the counter electrode 12 between a high-sensitivity exposure period and a low-sensitivity exposure period. The voltage applied from the voltage supply circuit 32 to the counter electrode 12 may vary by frames. The term "high-sensitivity exposure period" used herein refers to a period during which one of the positive and negative charges (i.e., signal charge) generated by photoelectric conversion is accumulated at the charge accumulation regions at a relatively high sensitivity. The term "low-sensitivity exposure period" used herein refers to a period during which one of the positive and negative charges (i.e., signal charge) generated by photoelectric conversion is accumulated at the charge accumulation regions at a relatively low sensitivity. The term "low sensitivity" used herein includes the case where the sensitivity is substantially zero.

Controlling the potential of the counter electrode 12 with respect to the pixel electrode 11 enables holes or electrons of the electron-hole pairs generated in the photoelectric conversion layer 15 by photoelectric conversion to be collected by the pixel electrode 11. For example, in the case where holes are used as signal charge carriers, the potential of the counter electrode 12 is controlled to be higher than that of the pixel electrode 11 in order to selectively collect the holes with the pixel electrode 11. The amount of signal charge collected per unit time varies with the difference in potential between the pixel electrode 11 and the counter electrode 12. In the example below, holes are used as signal charge carriers. Needless to say that electrons may also be used as signal charge carriers. The voltage supply circuit 32 is not limited to a specific power source circuit. The voltage supply circuit 32 may be a circuit that generates a predetermined voltage or a circuit that converts a voltage supplied from another power source into a predetermined voltage.

The unit pixels 10 are each connected to a power source line 40, through which a power source voltage VDD is supplied. As illustrated in FIG. 1, the power source line 40 is connected to the input terminal (typically, the drain) of the signal detection transistor 24. The power source line 40 serves as a source-follower power source, which enables the signal detection transistor 24 to amplify the signal generated by the photoelectric conversion unit 13 and output the amplified signal.

The output terminal (i.e., the source) of the signal detection transistor 24 is connected to the input terminal (i.e., the drain) of the address transistor 26. The output terminal (i.e., the source) of the address transistor 26 is connected to the corresponding one of a plurality of vertical signal lines 47, which are provided for the respective columns of the pixel array PA. The control terminal (i.e., the gate) of the address transistor 26 is connected to the corresponding one of address control lines 46. Controlling the potentials of the address control lines 46 enables the data output from the signal detection transistors 24 to be each selectively read out through the corresponding one of the vertical signal lines 47.

In the example illustrated in FIG. 1, the address control lines 46 are connected to a vertical scanning circuit 36 (also referred to as "row scanning circuit"). The vertical scanning circuit 36 selects a plurality of the unit pixels 10 disposed in each row on a row-by-row basis by applying a predetermined voltage to the corresponding one of the address control lines 46. This enables the signals to be read out from the selected unit pixels 10 and the pixel electrodes to be reset as described below.

The vertical signal lines 47 are main signal lines through which pixel signals are transmitted from the pixel array PA to the peripheral circuits. The vertical signal lines 47 are each connected to the corresponding one of column-signal processing circuits 37 (also referred to as "row-signal accumulation circuits"). The column-signal processing circuits 37 perform noise-reduction signal processing such as correlated double sampling, analog-digital conversion (AD conversion), and the like. As illustrated in FIG. 1, the column-signal processing circuits 37 are provided for the respective columns of the unit pixels 10 in the pixel array PA. The column-signal processing circuits 37 are connected to a horizontal signal readout circuit 38 (also referred to as "column-scanning circuit"), which sequentially reads out a signal from each of the column-signal processing circuits 37 output a signal to a horizontal common signal line 49.

In the example structure illustrated in FIG. 1, the unit pixels 10 each include a reset transistor 28. The reset transistor 28 may be a field-effect transistor or the like, similarly to the signal detection transistor 24 and the address transistor 26. In the example described below, the reset transistor 28 is an N-channel MOS transistor unless otherwise specified. As illustrated in FIG. 1, the reset transistor 28 is connected to a reset voltage line 44, through which a reset voltage Vr is supplied, and to the charge accumulation node 41. The control terminal (i.e., the gate) of the reset transistor 28 is connected to the corresponding one of reset control lines 48, and the potential of the charge accumulation node 41 is reset to the reset voltage Vr by controlling the potential of the reset control line 48. In this example, the reset control lines 48 are connected to the vertical scanning circuit 36. Thus, it is possible to reset a plurality of the unit pixels 10 which are disposed in each row on a row-by-row basis by the vertical scanning circuit 36 applying a predetermined voltage to the corresponding one of the reset control lines 48.

In this example, the reset voltage line 44, through which the reset voltage Vr is supplied to the reset transistors 28, is connected to a reset-voltage supply circuit 34 (hereinafter, referred to simply as "reset voltage source"). The reset voltage source 34 may have any structure that allows a predetermined reset voltage Vr to be supplied through the reset voltage line 44 during the operation of the imaging device 100 and is not limited to a specific power source circuit, similarly to the voltage supply circuit 32 described above. The voltage supply circuit 32 and the reset voltage source 34 may be parts of a single voltage supply circuit or independent voltage supply circuits. One or both of the voltage supply circuit 32 and the reset voltage source 34 may be a part of the vertical scanning circuit 36. Alternatively, a sensitivity control voltage may be supplied from the voltage supply circuit 32 to the unit pixels 10 via the vertical scanning circuit 36, and/or the reset voltage Vr may be supplied from the reset voltage source 34 to the unit pixels 10 via the vertical scanning circuit 36.

The power source voltage VDD supplied to the signal detection circuits 14 may be used as a reset voltage Vr. In such a case, the reset voltage source 34 may also be used as a voltage supply circuit (not illustrated in FIG. 1) that supplies a power source voltage to the unit pixels 10. Furthermore, it is possible to use the power source line 40 as the reset voltage line 44, which allows the arrangement of wires in the pixel array PA to be simplified. However, setting the reset voltage Vr to be different from the power source voltage VDD supplied to the signal detection circuits 14 increases the degree of flexibility in the control of the imaging device 100.

Device Structure of Unit Pixel

Figure 2:
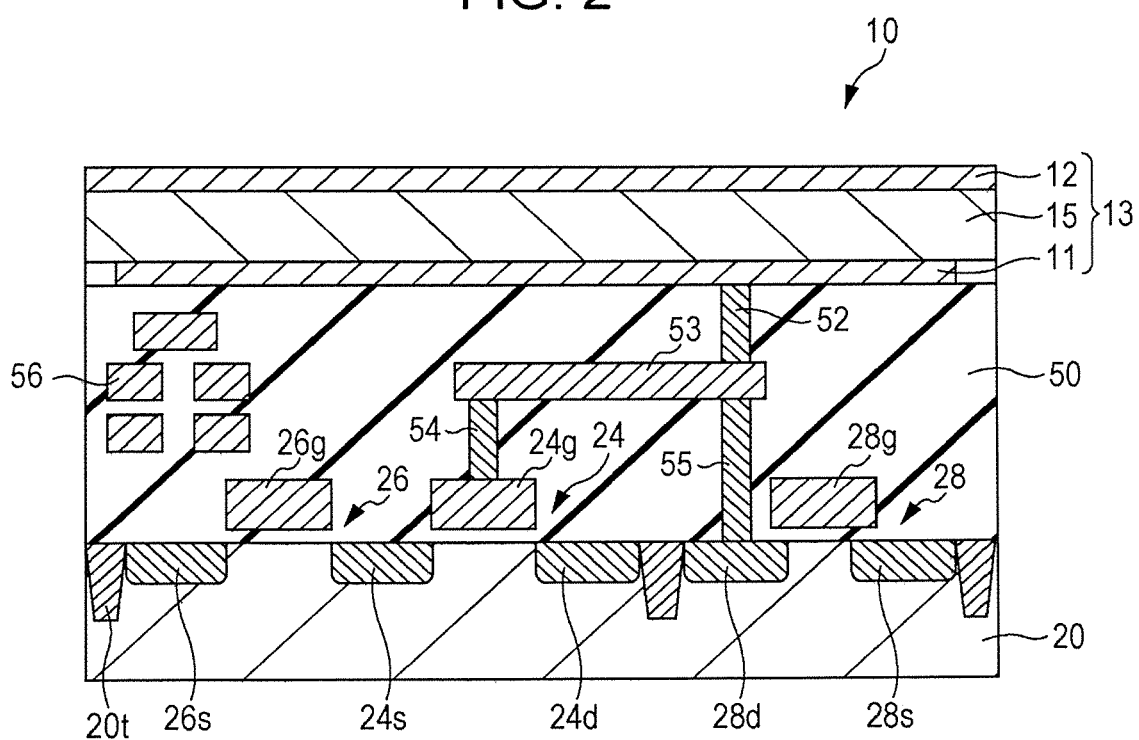
FIG. 2 is a schematic cross-sectional view of a unit pixel, illustrating an exemplary device structure of the unit pixel.

FIG. 2 schematically illustrates an exemplary device structure of the unit pixels 10. In the exemplary structure illustrated in FIG. 2, the above-described signal detection transistor 24, the address transistor 26, and the reset transistor 28 are disposed on a semiconductor substrate 20. The semiconductor substrate 20 is not limited to a substrate the entirety of which is composed of a semiconductor and may be an insulating substrate that includes a semiconductor layer on a surface thereof, the surface being on the same side as the photoelectric conversion unit 13. In the example described below, a p-type silicon (Si) substrate is used as a semiconductor substrate 20.

The semiconductor substrate 20 includes impurity regions (in this example, n-type regions) 26s, 24s, 24d, 28d, and 28s. The semiconductor substrate 20 also includes element separation regions 20t in order to electrically separate the unit pixels 10 from one another. In this example, an element separation region 20t is also interposed between the impurity regions 24d and 28d. For forming the element separation regions 20t, for example, the injection of acceptor ions may be performed under predetermined injection conditions.

The impurity regions 26s, 24s, 24d, 28d, and 28s are typically diffusion layers formed in the semiconductor substrate 20. As schematically illustrated in FIG. 2, the signal detection transistor 24 includes impurity regions 24s and 24d and a gate electrode 24g (typically, a polysilicon electrode). The impurity region 24s serves as, for example, the source region of the signal detection transistor 24. The impurity region 24d serves as, for example, the drain region of the signal detection transistor 24. The channel region of the signal detection transistor 24 is formed between the impurity regions 24s and 24d.

Similarly to the signal detection transistor 24, the address transistor 26 includes impurity regions 26s and 24s and a gate electrode 26g (typically, a polysilicon electrode), which is connected to the corresponding one of the address control lines 46 (see FIG. 1). In this example, the signal detection transistor 24 and the address transistor 26 are electrically connected to each other by sharing the impurity region 24s. The impurity region 26s serves as, for example, the source region of the address transistor 26. The impurity region 26s is connected to the corresponding one of vertical signal lines 47, which is not illustrated in FIG. 2 (see FIG. 1).

The reset transistor 28 includes impurity regions 28d and 28s and a gate electrode 28g (typically, a polysilicon electrode) connected to the corresponding one of reset control lines 48 (see FIG. 1). The impurity region 28s serves as, for example, the source region of the reset transistor 28. The impurity region 28s is connected to the reset voltage line 44, which is not illustrated in FIG. 2 (see FIG. 1).

An interlayer insulating layer 50 (typically, a silicon dioxide layer) is disposed on the semiconductor substrate 20 so as to cover the signal detection transistor 24, the address transistor 26, and the reset transistor 28. The interlayer insulating layer 50 may include a wiring layer 56 formed therein as illustrated in FIG. 2. The wiring layer 56 is typically composed of a metal such as copper and may include wires such as the vertical signal lines 47 described above. The number of insulating sublayers constituting the interlayer insulating layer 50 and the number of sublayers constituting the wiring layer 56 formed in the interlayer insulating layer 50 may be set appropriately and not limited to those in the example illustrated in FIG. 2.

The above-described photoelectric conversion unit 13 is disposed on the interlayer insulating layer 50. In other words, in an embodiment of the present disclosure, a plurality of unit pixels 10 constituting a pixel array PA (see FIG. 1) are formed on the semiconductor substrate 20. The unit pixels 10, which are arranged on the semiconductor substrate 20 in a two-dimensional array, form a photosensitive region (i.e., a pixel region). The distance (i.e., pixel pitch) between a pair of adjacent unit pixels 10 may be about 2 μm.

The photoelectric conversion unit 13 includes a pixel electrode 11, a counter electrode 12, and a photoelectric conversion layer 15 interposed therebetween. In this example, the counter electrode 12 and the photoelectric conversion layer 15 are formed so as to extend across a plurality of the unit pixels 10, while each of the unit pixels 10 is provided with one pixel electrode 11. Each of the pixel electrodes 11 is electrically separated from other pixel electrodes 11 included in the adjacent unit pixels 10 by being spatially separated from them.

The counter electrode 12 is typically a transparent electrode composed of a transparent conducting material. The counter electrode 12 is disposed on a side of the photoelectric conversion layer 15 on which light enters. That is, light that have transmitted through the counter electrode 12 enters the photoelectric conversion layer 15. The wavelength of light that can be detected by the imaging device 100 is not limited to be within the wavelength range of visible light (e.g., 380 nm or more and 780 nm or less). The term "transparent" used herein refers to passing at least part of light having a wavelength that falls within the detectable wavelength range, and it is not always necessary to pass light having any wavelength that falls within the wavelength range of the visible light. Hereinafter, all electromagnetic waves including infrared radiation and ultraviolet radiation are comprehensively referred to as "light" for the sake of convenience. The counter electrode 12 may be composed of a transparent conducting oxide (TCO) such as indium tin oxide (ITO), indium zinc oxide (IZO), aluminium-doped zinc oxide (AZO), fluorine-doped tin oxide (FTO), $SnO_2$, $TiO_2$, or $ZnO_2$.

The photoelectric conversion layer 15 generates electron-hole pairs upon receiving the incident light. The photoelectric conversion layer 15 is typically composed of an organic semiconductor material. Specific examples of the material of the photoelectric conversion layer 15 are described below.

As described above with reference to FIG. 1, the counter electrode 12 is connected to the corresponding one of the sensitivity control lines 42, which are connected to the voltage supply circuit 32. In this example, the counter electrode 12 is formed so as to extend across a plurality of the unit pixels 10. This enables the voltage supply circuit 32 to apply a desired sensitivity control voltage to a plurality of the unit pixels 10 at a time through the sensitivity control lines 42. Each of the unit pixels 10 may be provided with one counter electrode 12 when a desired sensitivity control voltage can be applied from the voltage supply circuit 32. Similarly, each of the unit pixels 10 may be provided with one photoelectric conversion layer 15.

Controlling the potential of the counter electrode 12 with respect to the pixel electrode 11 enables holes or electrons of the electron-hole pairs generated in the photoelectric conversion layer 15 due to photoelectric conversion to be collected by the pixel electrode 11. For example, in the case where holes are used as signal charge carriers, controlling the potential of the counter electrode 12 to be higher than that of the pixel electrode 11 enables the holes to be selectively collected by the pixel electrode 11. The amount of signal charge collected per unit time varies with the difference in potential between the pixel electrode 11 and the counter electrode 12. In the example described below, holes are used as signal charge carriers. Needless to say that electrons may alternatively be used as signal charge carriers.

The pixel electrode 11, which faces the counter electrode 12, collects positive or negative charge generated in the photoelectric conversion layer 15 due to photoelectric conversion, by applying an appropriate bias voltage between the counter electrode 12 and the pixel electrode 11. The pixel electrode 11 is composed of a metal such as aluminium or copper, a nitride of the metal, or a polysilicon or the like which has conductivity by being doped with an impurity.

The pixel electrode 11 may have a light-blocking property. When the pixel electrode 11 is, for example, a TaN electrode having a thickness of 100 nm, the pixel electrode 11 may have a sufficient light-blocking property. Using an electrode having a light-blocking property as a pixel electrode 11 may reduce the intrusion of light that transmits through the photoelectric conversion layer 15 into the channel regions or the impurity regions of the transistors formed on the semiconductor substrate 20, which are at least one of the signal detection transistor 24, the address transistor 26, and the reset transistor 28 in this example. A light-blocking film may optionally be formed in the interlayer insulating layer 50 by using the wiring layer 56 described above. Reducing the intrusion of the light into the channel regions of the transistors formed on the semiconductor substrate 20 may limit a shift of the properties of the transistors (e.g., the fluctuations in threshold voltage). Reducing the intrusion of the light into the impurity regions formed on the semiconductor substrate 20 may limit the mixing of noises unintendedly generated by photoelectric conversion occurring in the impurity regions. Thus, reducing the intrusion of the light into the semiconductor substrate 20 increases the reliability of the imaging device 100.

As schematically illustrated in FIG. 2, the pixel electrode 11 is connected to the gate electrode 24g of the signal detection transistor 24 with a plug 52, a wire 53, and a contact plug 54. In other words, the gate of the signal detection transistor 24 is electrically connected with the pixel electrode 11. The plug 52 and the wire 53 may be composed of a metal such as copper. The plug 52, the wire 53, and the contact plug 54 constitute at least a part of the charge accumulation node 41 (see FIG. 1), which is located between the signal detection transistor 24 and the photoelectric conversion unit 13. The wire 53 may constitute a part of the wiring layer 56. The pixel electrode 11 is also connected to the impurity region 28d with the plug 52, the wire 53, and a contact plug 55. In the exemplary structure illustrated in FIG. 2, the gate electrode 24g of the signal detection transistor 24, the plug 52, the wire 53, the contact plugs 54 and 55, and the impurity region 28d, which serves as a source or drain region of the reset transistor 28, function as a charge accumulation region where the signal charge collected by the pixel electrode 11 is accumulated.

Upon the signal charge being collected by the pixel electrode 11, a voltage correspondent to the amount of signal charge accumulated at the charge accumulation region is applied to the gate of the signal detection transistor 24. The signal detection transistor 24 amplifies the voltage. The voltage amplified by the signal detection transistor 24 is selectively read out as a signal voltage via the address transistor 26.

Photoelectric Conversion Layer

An example of the photoelectric conversion layer 15 is described below.

The photoelectric conversion layer 15 typically includes a semiconductor material. In the example described below, an organic semiconductor material is used as a semiconductor material.

The photoelectric conversion layer 15 includes, for example, tin naphthalocyanine represented by General Formula (1) below (hereinafter, this tin naphthalocyanine is referred to simply as "tin naphthalocyanine").

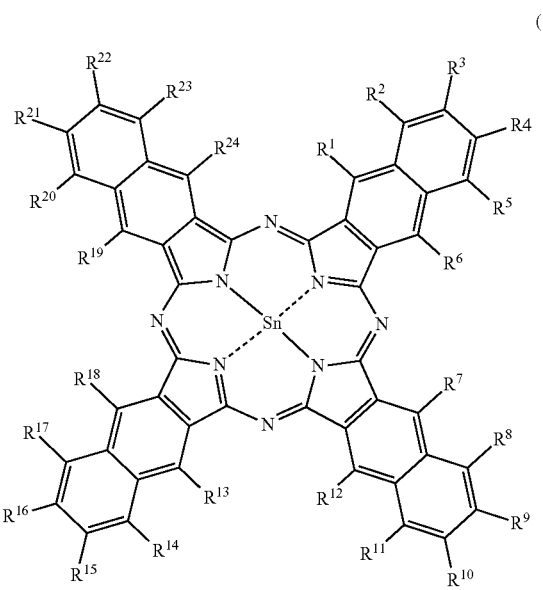

(1)

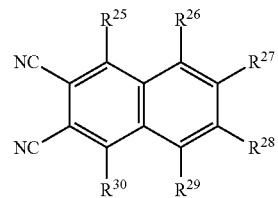

(2)

In the tin naphthalocyanine represented by General Formula (1) above, it is advantageous that 8 or more of $R^1$ to $R^{24}$ are a hydrogen atom or a heavy hydrogen atom, it is more advantageous that 16 or more of $R^1$ to $R^{24}$ are a hydrogen atom or a heavy hydrogen atom, and it is further advantageous that all of $R^1$ to $R^{24}$ are a hydrogen atom or a heavy hydrogen atom in terms of ease of control of cohesion of the molecules. The tin naphthalocyanine represented by Formula (3) below is advantageous in terms of ease of synthesis.

In General Formula (1), $R^1$ to $R^{24}$ each independently represent a hydrogen atom or a substituent group. The substituent group is not limited to a specific substituent group and may be selected from the following: a heavy hydrogen atom, a halogen atom, an alkyl group (including a cycloalkyl group, a bicycloalkyl group, and a tricycloalkyl group), an alkenyl group (including a cycloalkenyl group and a bicycloalkenyl group), an alkynyl group, an aryl group, a heterocyclic group, a cyano group, a hydroxy group, a nitro group, a carboxy group, an alkoxy group, an aryloxy group, a silyloxy group, a heterocyclic oxy group, an acyloxy group, a carbamoyloxy group, an alkoxycarbonyloxy group, an aryloxycarbonyloxy group, an amino group (including an anilino group), an ammonio group, an acylamino group, an aminocarbonylamino group, an alkoxycarbonylamino group, an aryloxycarbonylamino group, a sulfamoylamino group, an alkylsulfonylamino group, an arylsulfonylamino group, a mercapto group, an alkylthio group, an arylthio group, a heterocyclic thio group, a sulfamoyl group, a sulfo group, an alkylsulfinyl group, an arylsulfinyl group, an alkylsulfonyl group, an arylsulfonyl group, an acyl group, an aryloxycarbonyl group, an alkoxycarbonyl group, a carbamoyl group, an arylazo group, a heterocyclic azo group, an imido group, a phosphino group, a phosphinyl group, a phosphinyloxy group, a phosphinylamino group, a phosphono group, a silyl group, a hydrazino group, a ureido group, a boronic acid group (—B(OH)$_2$), a phosphate group (—OPO(OH)$_2$), a sulfate group (—OSO$_3$H), and other known substituent groups.

The tin naphthalocyanine represented by General Formula (1) above may be a commercially available one. Alternatively, the tin naphthalocyanine represented by General Formula (1) above may be synthesized, for example, by using the naphthalene derivative represented by General Formula (2) below as a starting material as described in Japanese Unexamined Patent Application Publication No. 2010-232410. The substituent groups represented by $R^{25}$ to $R^{30}$ in General Formula (2) may be the same as those represented by $R^1$ to $R^{24}$ in General Formula (1).

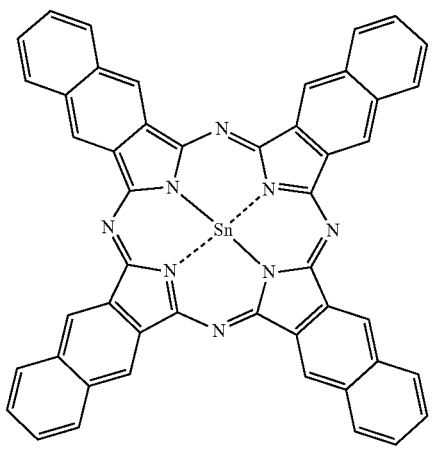

(3)

Figure 3:
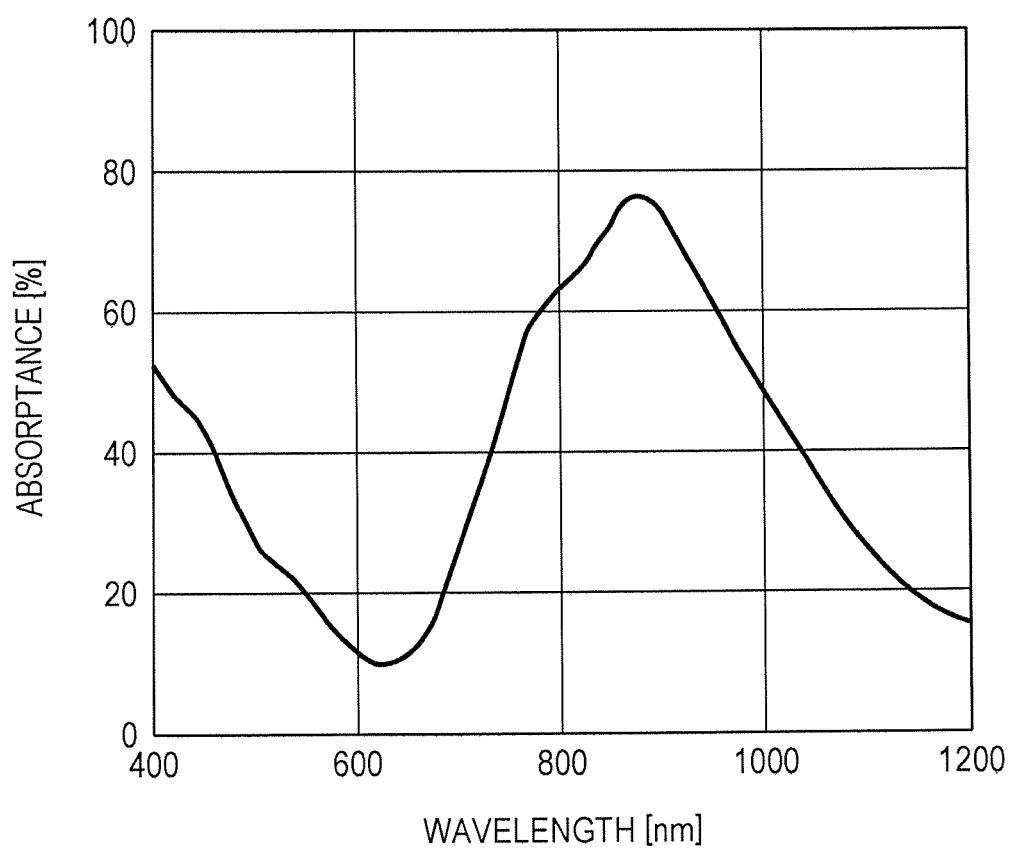
FIG. 3 is a diagram illustrating an example absorption spectrum of a photoelectric conversion layer that includes tin naphthalocyanine.

The tin naphthalocyanine represented by General Formula (1) above absorbs light having a wavelength of about 200 nm or more and 1100 nm or less. For example, the tin naphthalocyanine represented by Formula (3) has an absorption peak at a wavelength of about 870 nm as illustrated in FIG. 3. FIG. 3 illustrates an example of an absorption spectrum of a photoelectric conversion layer that includes the tin naphthalocyanine represented by Formula (3). The measurement of the absorption spectrum is made by using a sample prepared by stacking a photoelectric conversion layer (thickness: 30 nm) on a quartz substrate.

The absorption spectrum illustrated in FIG. 3 confirms that a photoelectric conversion layer composed of a material including tin naphthalocyanine absorbs light in the near-infrared region. That is, selecting a material including tin naphthalocyanine as a material of the photoelectric conversion layer 15 enables, for example, a photosensor capable of detecting the near-infrared radiation to be produced.

Figure 4:
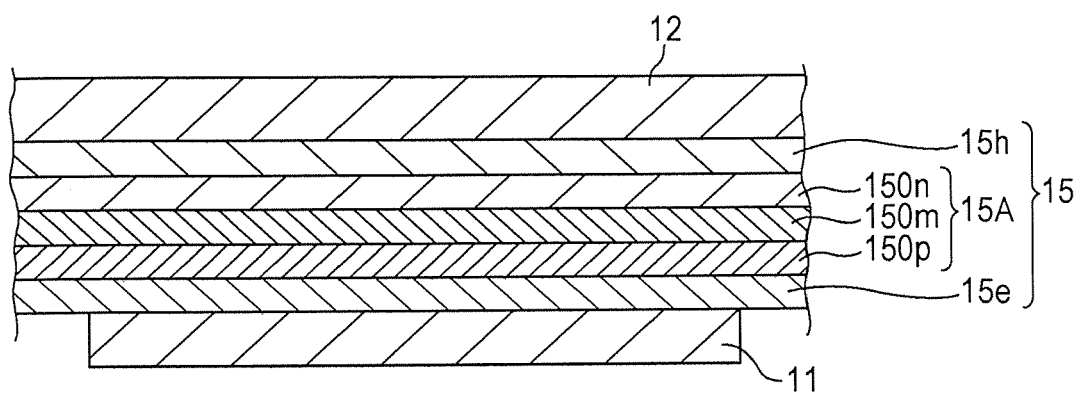
FIG. 4 is a schematic cross-sectional view of a photoelectric conversion layer, illustrating an example structure of the photoelectric conversion layer.

FIG. 4 schematically illustrates an exemplary structure of the photoelectric conversion layer 15. In the exemplary structure illustrated in FIG. 4, the photoelectric conversion layer 15 includes a hole-blocking layer 15$h$, a photoelectric conversion structure 15A composed of an organic semiconductor material including the tin naphthalocyanine represented by General Formula (1) above, and an electron-blocking layer 15e. The hole-blocking layer 15h is interposed between the photoelectric conversion structure 15A and the counter electrode 12. The electron-blocking layer 15e is interposed between the photoelectric conversion structure 15A and the pixel electrode 11.

The photoelectric conversion structure 15A illustrated in FIG. 4 includes at least one of a p-type semiconductor and an n-type semiconductor. In the exemplary structure illustrated in FIG. 4, the photoelectric conversion structure 15A includes a p-type semiconductor layer 150p, an n-type semiconductor layer 150n, and a mixed layer 150m interposed between the p-type and n-type semiconductor layers 150p and 150n. The p-type semiconductor layer 150p is interposed between the electron-blocking layer 15e and the mixed layer 150m and responsible for photoelectric conversion and/or hole transportation. The n-type semiconductor layer 150n is interposed between the hole-blocking layer 15h and the mixed layer 150m and responsible for photoelectric conversion and/or electron transportation. As described below, the mixed layer 150m may optionally include at least one of a p-type semiconductor and an n-type semiconductor.

The p-type and n-type semiconductor layers 150p and 150n include a p-type organic semiconductor and an n-type organic semiconductor, respectively. That is, the photoelectric conversion structure 15A includes at least one of a p-type organic semiconductor and an n-type organic semiconductor in addition to the organic photoelectric conversion material including the tin naphthalocyanine represented by General Formula (1) above.

The p-type organic semiconductor (compound) is a donor-type organic semiconductor (compound) which is likely to donate electrons to others, such as a hole-transporting organic compound. More specifically, in the case where two organic materials are used while they are in contact with each other, the term "p-type organic semiconductor (compound)" used herein refers to an organic compound having a lower ionization potential. Thus, the donor-type organic compound may be any organic compound having an electron-donating property. Examples of such an organic compound include triarylamines, benzidines, pyrazolines, styrylamines, hydrazones, triphenylmethanes, carbazoles, polysilanes, thiophenes, phthalocyanines, cyanines, merocyanines, oxonols, polyamines, indoles, pyrroles, pyrazoles, polyarylenes, condensed aromatic carbocyclic compounds (e.g., a naphthalene derivative, an anthracene derivative, a phenanthrene derivative, a tetracene derivative, a pyrene derivative, a perylene derivative, and a fluoranthene derivative), and metal complexes including a nitrogen-containing heterocyclic compound as a ligand. Examples of the donor-type organic semiconductor are not limited to the above compounds. As described above, any organic compound having a lower ionization potential than an organic compound used as an n-type (acceptor-type) compound may be used as a donor-type organic semiconductor. The above-described tin naphthalocyanine is an example of the p-type organic semiconductor material.

The n-type organic semiconductor (compound) is an acceptor-type organic semiconductor (compound) which is likely to accept electrons, such as an electron-transporting organic compound. More specifically, in the case where two organic compounds are used while they are in contact with each other, the n-type organic semiconductor (compound) is an organic compound having a larger electron affinity. Thus, any organic compound capable of accepting electrons may be used as an acceptor-type organic compound. Examples of such an organic compound include fullerene, fullerene derivatives, condensed aromatic carboncyclic compounds (e.g., a naphthalene derivative, an anthracene derivative, a phenanthrene derivative, a tetracene derivative, a pyrene derivative, a perylene derivative, and a fluoranetene derivative), five- or seven-membered heterocyclic compounds containing a nitrogen atom, an oxygen atom, or a sulfur atom (e.g., pyridine, pyradine, pyrimidine, pyridadine, triazine, quinoline, quinoxaline, quinazoline, phthalazine, cinnoline, isoquinoline, pteridine, acridine, phenazine, phenanthroline, tetrazole, pyrazole, imidazole, thiazole, oxazole, indazole, benzimidazole, benzotriazole, benzoxazole, benzothiazole, carbazole, purine, triazolopyridadine, triazolopyrimidine, tetrazaindene, oxadiazole, imidazopyridine, pyrrolidine, pyrrolopyridine, thiadiazolopyridine, dibenzazepine, and tribenzazepine), polyarylenes, fluorenes, cyclopentadienes, silyl compounds, and metal complexes including a nitrogen-containing heterocyclic compound as a ligand. Examples of the acceptor-type organic semiconductor are not limited to the above compounds. As described above, any organic compound having a larger electron affinity than an organic compound used as a p-type (donor-type) compound may be used as an acceptor-type organic semiconductor.

The mixed layer 150m may be, for example, a layer having a bulk heterojunction structure including a p-type semiconductor and an n-type semiconductor. For forming the mixed layer 150m including the bulk heterojunction structure, the tin naphthalocyanine represented by General Formula (1) above may be used as a p-type semiconductor material, and fullerene and/or a fullerene derivative may be used as an n-type semiconductor material. It is advantageous that the material of the p-type semiconductor layer 150p be the same as that of the p-type semiconductor material included in the mixed layer 150m. Similarly, it is advantageous that the material of the n-type semiconductor layer 150n be the same as that of the n-type semiconductor material included in the mixed layer 150m. The bulk heterojunction structure is described in detail in Japanese Patent No. 5553727, the entire contents of which are incorporated by reference herein.

By using materials appropriate to the wavelength region in which light is to be detected, it is possible to produce an imaging device having sensitivity in the desired wavelength region. The photoelectric conversion layer 15 may include an inorganic semiconductor material such as amorphous silicon. The photoelectric conversion layer 15 may include a sublayer composed of an organic material and a sublayer composed of an inorganic material. In the example described below, the photoelectric conversion layer 15 has a bulk heterojunction structure formed by codeposition of tin naphthalocyanine and $C_{60}$.

Action of Imaging Device

Figure 5:
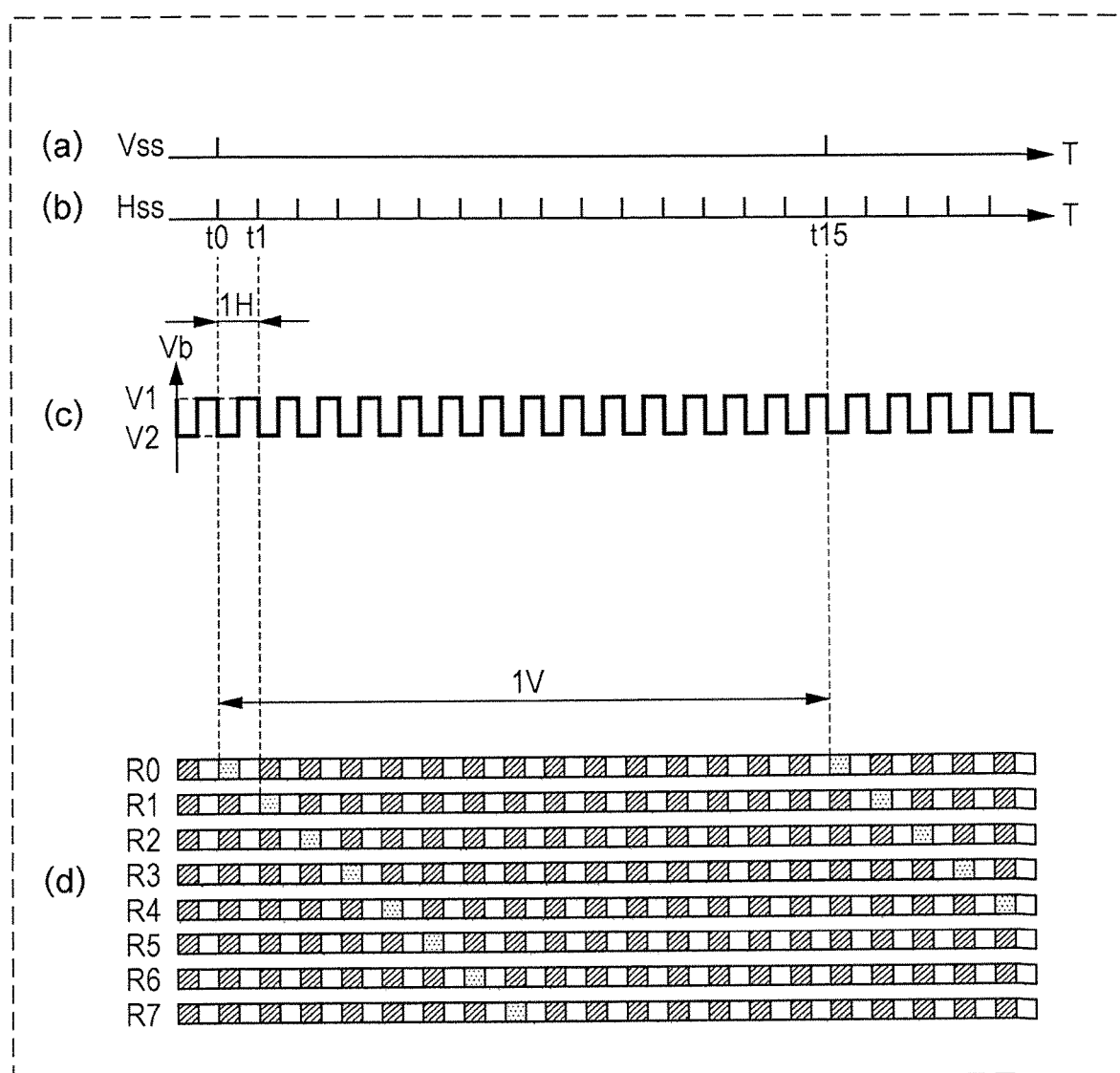
FIG. 5 includes diagrams used for explaining an example of the action of an imaging device according to an embodiment of the present disclosure.

A method for acquiring an image in which the high-sensitivity exposure period and the low-sensitivity exposure period are used is described below with reference to FIG. 5. FIG. 5 includes timing charts illustrating an example of the action of the imaging device according to an embodiment of the present disclosure. FIG. 5(a) illustrates the timing of the rise (or fall) of a vertical synchronizing signal Vss. FIG. 5(b) illustrates the timing of the rise (or fall) of a horizontal synchronizing signal Hss. FIG. 5(c) illustrates an example of a change, with time, in the voltage Vb applied from the voltage supply circuit 32 to the counter electrodes 12 via the sensitivity control lines 42. FIG. 5(d) schematically illustrates the timings of resetting, high-sensitivity exposure, and low-sensitivity exposure of each row of the pixel array PA.

An example of the action of the imaging device 100 is described below with reference to FIGS. 1, 2, and 5. For the sake of simplicity, an example of the action of an imaging device 100 that includes a pixel array PA including pixels arranged in 8 rows in total, that is, namely, the R0-th to R7-th rows, is described below.

For acquiring an image, first, the charge accumulation region of each of the unit pixels 10 included in the pixel array PA is reset, and a pixel signal is read out from each of the reset unit pixels 10. For example, as illustrated in FIG. 5, the resetting of a plurality of pixels in the R0-th row is started in response to the vertical synchronizing signal Vss (Time t0). In FIG. 5, the rectangular portions filled with dots schematically represent a period during which a signal is read out. The readout period may include a resetting period during which the potential of the charge accumulation region of each unit pixel 10 is reset.

For resetting the pixels in the R0-th row, the address transistors 26 whose gates are connected to the specific one of the address control lines 46 which belongs to the R0-th row are turned on by controlling the potential of the address control line 46. Furthermore, the reset transistors 28 whose gates are connected to the specific one of the reset control lines 48 which belongs to the R0-th row are turned on by controlling the potential of the reset control line 48. Thus, the charge accumulation node 41 and the reset voltage line 44 are connected to each other, and a reset voltage Vr is supplied to each charge accumulation region. Specifically, the potential of the gate electrode 24g of each signal detection transistor 24 and the potential of the pixel electrode 11 of each photoelectric conversion unit 13 are reset to be the reset voltage Vr. Subsequently, a pixel signal is read out from each of the reset unit pixels 10 in the R0-th row via the corresponding one of the vertical signal lines 47. These pixel signals are correspondent to the reset voltage Vr. Subsequent to the readout of the pixel signals, the reset transistors 28 and the address transistors 26 are turned off.

In this example, the pixels in each of the R0-th to R7-th rows are reset sequentially on a row-by-row basis in response to a horizontal synchronizing signal Hss as schematically illustrated in FIG. 5. In other words, the pixel array PA is driven in a rolling shutter mode. Hereinafter, the intervals between the pulses of the horizontal synchronizing signal Hss, that is, the period from when a row is selected to when the next row is selected, is referred to as "1H period". In this example, for example, the period between Time t0 and Time t1 corresponds to the 1H period.

As illustrated in FIG. 5, a voltage V1 supplied form the voltage supply circuit 32 is applied to the counter electrodes 12 during the latter part of each 1H period. The voltage V1 is the voltage applied during imaging, that is, the voltage at which accumulation of charge is performed, and is set to, for example, about 10 V (Time t0 to Time t15).

In FIG. 5, the blank rectangular portions schematically represent the high-sensitivity exposure period in each row. The high-sensitivity exposure period is started upon the voltage supply circuit 32 changing the voltage applied to the counter electrodes 12 to the voltage V1, which is higher than a voltage V2. In FIG. 5, the rectangular portions filled with dots and shaded rectangular portions schematically represent the low-sensitivity exposure period. The low-sensitivity exposure period is started upon the voltage supply circuit 32 changing the voltage applied to the counter electrodes 12 to the voltage V2. The voltage V2 is lower than the voltage V1 and typically set such that the difference in potential between the pixel electrodes 11 and the counter electrodes 12 is 0 V or less. The voltage V2 may be set to, for example, a voltage comparable to the reset voltage of the charge accumulation regions.

Under the condition where the bias voltage applied to the photoelectric conversion layers 15 is 0 V, most of the charge generated in the photoelectric conversion layers 15 is eliminated. This is presumably because most of the positive and negative charges generated due to exposure quickly recombine with each other and disappear.

On the other hand, the signal charge accumulated at the charge accumulation regions during the high-sensitivity exposure period is not eliminated but maintained until the pixels are reset.

In the next 1H period, the low-sensitivity exposure is again started upon the voltage supply circuit 32 changing the voltage applied to the counter electrodes 12 to the voltage V2. In the above manner, the low-sensitivity exposure period and the high-sensitivity exposure period are alternately repeated every 1H period (Time t0 to Time t15). In this embodiment of the present disclosure, selecting the voltage applied to the counter electrodes 12 between the voltage V2 and the voltage V1 enables switchover between the high-sensitivity exposure period and the low-sensitivity exposure period in the 1H period.

As described above, the signal charge accumulated in the charge accumulation regions is maintained during the low-sensitivity exposure period. As a result, when the high-sensitivity exposure period and the low-sensitivity exposure period are alternately repeated, the signal charge accumulated in each high-sensitivity exposure period is integrated. The inventors of the present invention are the first to find the above knowledge. In the case where a positive bias voltage is applied to the photoelectric conversion layers during the low-sensitivity exposure period, the accumulation of signal charge occurs also during the low-sensitivity exposure period. In such a case, the signal charge accumulated in the low-sensitivity exposure period can be integrated in addition to that accumulated in the high-sensitivity exposure period.

It is possible to change the amount of exposure time by changing the ratio between the lengths of the high-sensitivity exposure period and the low-sensitivity exposure period in the 1H period, that is, the duty ratio of the voltage applied to the counter electrodes 12.

Subsequently, signal charge is read out from the pixels in each row of the pixel array PA in response to the horizontal synchronizing signal Hss. In this example, signal charge is read out from the pixels in each of the R0-th to R7-th rows sequentially on a row-by-row basis from Time t15. Hereinafter, the period from when pixels in a row are selected to when the pixels in the row are again selected may be referred to as "1V period". In this example, the period from Time t0 to Time t15 corresponds to the 1V period in the R0-th row. The 1V period corresponds to one frame in each row. Thus, the high-sensitivity exposure period is repeated a plurality of times in each frame in order to perform multiple exposure in each row.

Signal charge is read out from the pixels in the R0-th row at Time t15, that is, subsequent to the end of the 1V period in which the high-sensitivity exposure period and the low-sensitivity exposure period are alternately repeated. At this time, the address transistors 26 in the R0-th row are turned on. This allows the pixel signal responsive to the amount of charge accumulated in each charge accumulation region during a plurality of high-sensitivity exposure periods to be output through the corresponding one of the vertical signal lines 47. The pixels may be reset subsequent to the readout of the pixel signals by turning on the respective reset transistors 28. Subsequent to the readout of the pixel signals, the address transistors 26 (and the reset transistors 28) are turned off. Subsequent to the readout of signal charge, the differences between the signals read out at Time to and the signals read out at Time t15 are determined in order to remove fixed noises from the signals. Subsequently, the next 1V period is started in each row. An image of one frame is created by compositing signals read out from each row. Although the timings of the start and the end of the exposure period, the readout of signals, and the resetting of the pixels are different in each row due to a rolling-shutter mode operation, multiple exposure is performed in the entire image as a result of repetition of the high-sensitivity exposure period and the low-sensitivity exposure period in each frame. This enables image data to be acquired during the high-sensitivity exposure period at a plurality of timings. The composition of the signal charge by multiple exposure is performed in the charge accumulation region included in each pixel.

Figure 6:
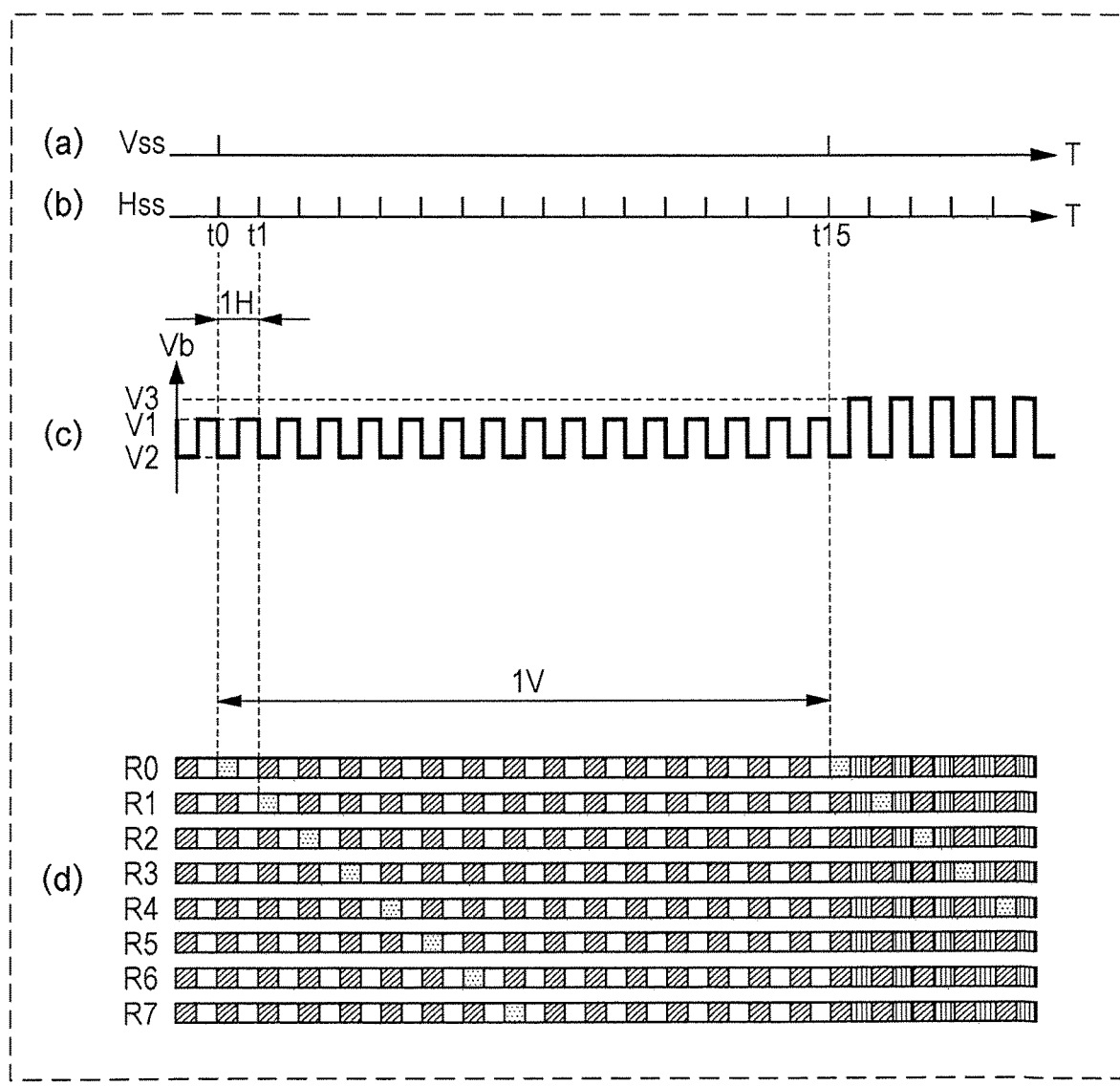
FIG. 6 includes diagrams used for explaining another example of the action of an imaging device according to an embodiment of the present disclosure.

Another embodiment in which the amount of exposure is changed between frames is described below. FIG. 6 is a diagram illustrating an example of the action of the imaging device according to an embodiment of the present disclosure. Similarly to FIG. 5, FIG. 6(a) illustrates the timing of the rise (or fall) of a vertical synchronizing signal Vss. FIG. 6(b) illustrates the timing of the rise (or fall) of a horizontal synchronizing signal Hss. FIG. 6(c) illustrates an example of a change, with time, in the voltage Vb applied from the voltage supply circuit 32 to the counter electrodes 12 via the sensitivity control lines 42. FIG. 6(d) schematically illustrates the timings of resetting, high-sensitivity exposure, and low-sensitivity exposure in each row of the pixel array PA. FIG. 6(d) is different from FIG. 5(d) in that the voltage applied from the voltage supply circuit 32 to the counter electrodes 12 during the high-sensitivity exposure period in the second 1V period (Frame f2) subsequent to the first 1V period (Frame f1) is set to a voltage V3, which is higher than the voltage V1. In FIG. 6(d), the rectangular portions filled with vertical lines represent the high-sensitivity exposure period during which the voltage V3 is applied. The change in the voltage Vb applied to the counter electrodes 12 is (V1−V2) in Frame f1 and (V1−V3) in Frame f2. Thus, the amount of change in the voltage Vb applied to the counter electrodes 12 between the high-sensitivity exposure period and the low-sensitivity exposure period varies between Frame f1 and Frame f2. The amount of change in the voltage Vb applied to the counter electrodes 12 is consistently (V1−V2) during Frame f1. The amount of change in the voltage Vb applied to the counter electrodes 12 is consistently (V1−V3) during Frame f2.

During the high-sensitivity exposure period in Frame f2, a higher voltage V3 is applied to the counter electrodes 12, and the sensitivity of each of the unit pixels is accordingly increased. In other words, the sensitivity of each unit pixel per unit time in the high-sensitivity exposure period in the frame after t15 is changed compared with that in the high-sensitivity exposure period in the frame from t0 to t15. However, as illustrated in FIG. 6, the lengths of the high-sensitivity exposure period and the low-sensitivity exposure period are the same between the frame from t0 to t15 and the frame after t15. Accordingly, the operation illustrated in FIG. 6 enables the amount of exposure to be changed without changing the amount of exposure time by changing the sensitivity of the unit pixels. Thus, according to this embodiment of the present disclosure, it is possible to control the amount of exposure without changing the degree of blurring of the subject by frames.

Figure 7:
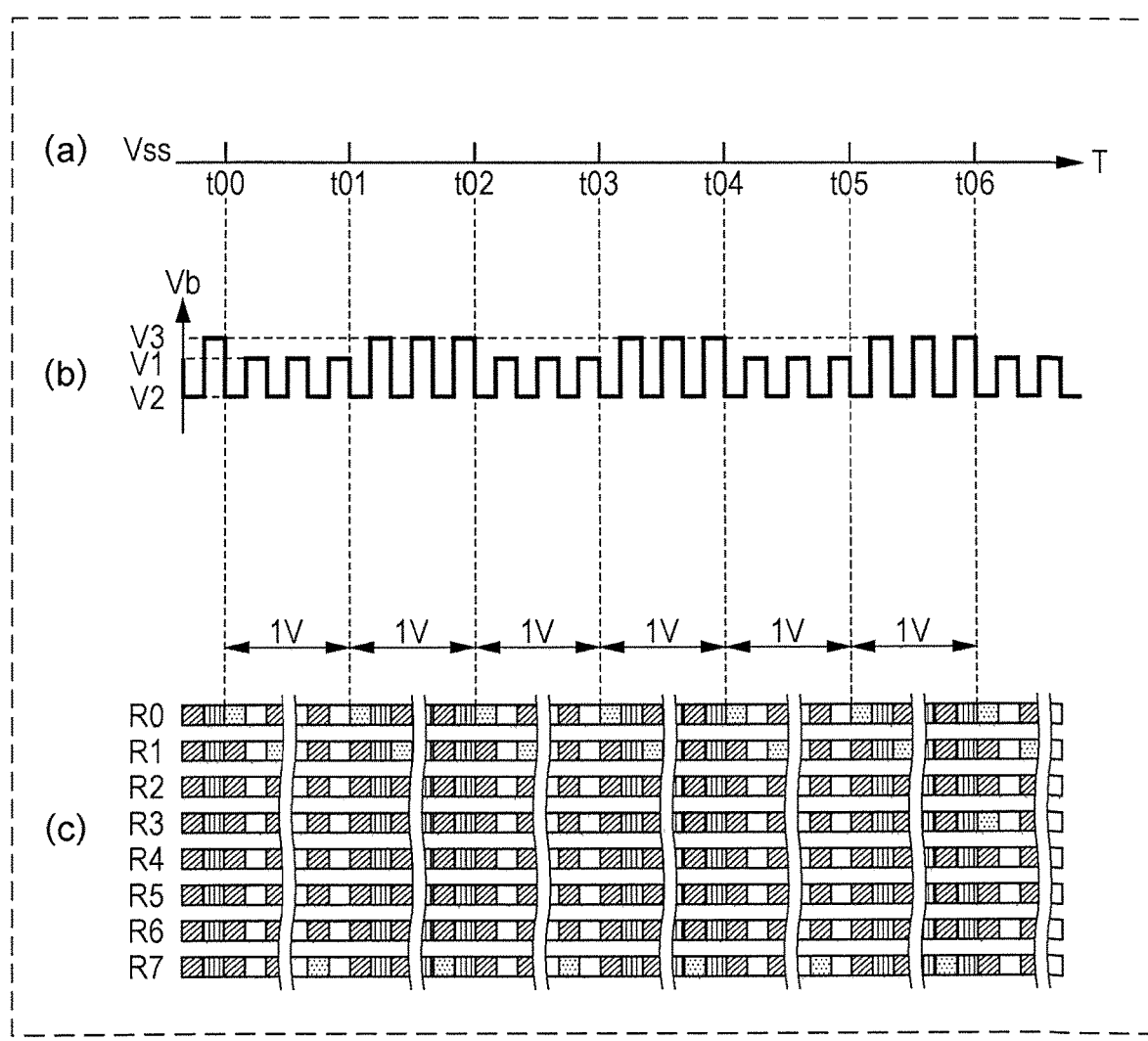
FIG. 7 includes diagrams used for explaining another example of the action of an imaging device according to an embodiment of the present disclosure.

FIG. 7 illustrates examples of timing charts in which the above-described action is repeated. FIG. 7(a) illustrates the timing of the rise (or fall) of a vertical synchronizing signal Vss. FIG. 7(b) illustrates an example of a change, with time, in the voltage Vb applied from the voltage supply circuit 32 to the counter electrodes 12. FIG. 7(c) schematically illustrates the timings of resetting, high-sensitivity exposure, and low-sensitivity exposure in each row of the pixel array PA.

As illustrated in FIG. 7, the voltage Vb applied to the counter electrodes 12 during the high-sensitivity exposure periods is switched between V1 and V3 in each frame. Driving the imaging device in this manner enables a high-sensitivity image and a low-sensitivity image to be alternately formed in each frame. Integrating an image captured in the N-th frame with an image captured in the (N+1)-th frame enables a high-dynamic-range image with an extended dynamic range to be formed.

As described above, according to the embodiment of the present disclosure, the start and end of the high-sensitivity exposure period and the start and end of the low-sensitivity exposure period are controlled by changing the voltage Vb applied to the counter electrodes 12. Furthermore, the amount of exposure is controlled by changing the potential of the voltage V1 applied to the counter electrodes 12 during the high-sensitivity exposure period. That is, according to the embodiment of the present disclosure, in which the amount of exposure time is not changed, it is possible to control the amount of exposure without changing the degree of blurring of the subject. In addition, it is not necessary to dispose elements such as transfer gates in each of the unit pixels 10. This is advantageous in terms of a reduction in the size of pixels.

The imaging device according to an embodiment of the present disclosure may be used as an image sensor or the like and may be included in a camera for medical use, a camera for robot control, a security camera, a camera for automotive use, or the like. In a camera for automotive use, the imaging device according to an embodiment of the present disclosure may be used, for example, as an input device for a control device that governs control in order to achieve safe driving of a vehicle. The imaging device according to an embodiment of the present disclosure may also be used for aiding an operator to drive a vehicle safely.

What is claimed is:

1. An imaging device comprising:
  pixel array including pixels, each of the pixels including:
    a photoelectric converter including a first electrode, a second electrode, and a first photoelectric conversion layer between the first electrode and the second electrode, the first photoelectric conversion layer generating signal charge, and
    a transistor having a gate coupled to the first electrode, the transistor being configured to output a signal corresponding to an amount of the signal charge collected by the first electrode; and
  voltage supply circuitry coupled to the second electrode of each of the pixels, wherein
  the voltage supply circuitry, in each of consecutive frame periods,
    supplies a first voltage two or more times to form exposure periods in which the signal charge is collected by the first electrode, and
    supplies a second voltage one or more times to form non-exposure periods that separate the exposure periods from each other, and
  start time of each of the exposure periods is periodic over the consecutive frame periods.

2. The imaging device according to claim 1, wherein a rate of a length of the exposure periods to a length of the non-exposure periods in one of the consecutive frame periods is different from a rate of a length of the exposure periods to a length of the non-exposure periods in another one of the consecutive frame periods.

3. The imaging device according to claim 1, further comprising a control circuitry that causes the voltage supply circuitry to supply the first voltage and the second voltage.

4. The imaging device according to claim 1, wherein the transistor outputs the signal as image data corresponding to one frame, the signal including a signal obtained in each of the exposure periods.

5. The imaging device according to claim 1, further comprising control circuitry, wherein the control circuitry causes the pixel array to be driven in a rolling shutter mode.

6. An imaging device comprising:
pixel array including pixels, each of the pixels including:
a photoelectric converter including a first electrode, a second electrode, and a first photoelectric conversion layer between the first electrode and the second electrode, the first photoelectric conversion layer generating signal charge, and
a transistor having a gate coupled to the first electrode, the transistor being configured to output a signal corresponding to an amount of the signal charge collected by the first electrode; and
voltage supply circuitry coupled to the second electrode of each of the pixels, wherein
the voltage supply circuitry, in each of consecutive frame periods,
supplies a first voltage two or more times to form exposure periods in which the signal charge is collected by the first electrode, and
supplies a second voltage one or more times to form non-exposure periods that separate the exposure periods from each other, and
start time of each of the non-exposure periods is periodic over the consecutive frame periods.

7. The imaging device according to claim 6, wherein a rate of a length of the exposure periods to a length of the non-exposure periods in one of the consecutive frame periods is different from a rate of a length of the exposure periods to a length of the non-exposure periods in another one of the consecutive frame periods.

8. The imaging device according to claim 6, further comprising a control circuitry that causes the voltage supply circuitry to supply the first voltage and the second voltage.

9. The imaging device according to claim 6, wherein the transistor outputs the signal as image data corresponding to one frame, the signal including a signal obtained in each of the exposure periods.

10. The imaging device according to claim 6, further comprising control circuitry, wherein the control circuitry causes the pixel array to be driven in a rolling shutter mode.

* * * * *